(12) United States Patent
Lin

(10) Patent No.: US 7,037,073 B2
(45) Date of Patent: May 2, 2006

(54) COOLING FAN WITH A LIGHT-EMITTING DEVICE

(75) Inventor: Jen-Cheng Lin, Taipei Hsein (TW)

(73) Assignee: Cooler Master Co., Ltd., Chung-Ho City (TW)

( * ) Notice: Subject to any disclaimer, the term of this patent is extended or adjusted under 35 U.S.C. 154(b) by 0 days.

(21) Appl. No.: 10/893,657

(22) Filed: Jul. 16, 2004

(65) Prior Publication Data

US 2006/0012973 A1    Jan. 19, 2006

(51) Int. Cl.
  *F01D 25/00*    (2006.01)
(52) U.S. Cl. .......................................... 416/5; 362/500
(58) Field of Classification Search ................. 362/35, 362/500, 269; 416/5
  See application file for complete search history.

(56) References Cited

U.S. PATENT DOCUMENTS

| | | | | |
|---|---|---|---|---|
| 6,790,003 B1* | 9/2004 | Hu et al. | ........................ | 416/5 |
| 2003/0231956 A1* | 12/2003 | Lin | ............................ | 415/118 |
| 2005/0244309 A1* | 11/2005 | Wang | ...................... | 422/186.3 |

* cited by examiner

*Primary Examiner*—Sandra O'Shea
*Assistant Examiner*—Robert May
(74) *Attorney, Agent, or Firm*—Alan D. Kamrath; Nikolai & Mersereau, P. A.

(57) ABSTRACT

The cooling fan has a frame and at least one light-emitting diode (LED). The frame has a central block with a circuit and multiple ribs. The ribs are formed on the rear surface of the frame, extend to the center of the inner space and have at least one set hole. The at least one LED is mounted respectively in the at least one set hole to emit light and faces to the front surface of the frame.

1 Claim, 4 Drawing Sheets

COOLING FAN WITH A LIGHT-EMITTING DEVICE

BACKGROUND OF THE INVENTION

1. Field of the Invention

The present invention relates to a cooling fan, especially to a cooling fan with a light-emitting device.

2. Description of the Prior Arts

As the computer is used universally, it not only has to be practical but also to be attractive in appearance. Therefore people start to use many methods to enhance the appearance of the computer. One of the methods is to make the cooling fan to emit light. A conventional light-emitting cooling fan is commonly used with a transparent case to let the light radiate from the case and uses multiple light-emitting diodes (LED) to emit the light. A conventional light-emitting cooling fan substantially comprises a frame, a rotor and multiple LEDs. The frame has an inside space with an inner surface. The rotor is rotatably mounted in the inside space of the frame. The LEDs are mounted around an inside surface of the inner space in the frame or attached to the rotor. The light that the LED emits goes almost straight and hardly goes separately. When the light is emitted, the light hits the rotor or the inside surface of the cooling fan and is reflected out of the case. Therefore the light cannot go out of the case directly. The brightness of the light that has been reflected is weak. Furthermore, no matter how many LEDs are used or how many colors that the LEDs emit, the light emitting from the LEDs attached to a rotating rotor will only show a circle and the light cannot be arranged to a certain kind of pattern.

To overcome the shortcomings, the present invention provides a cooling fan with a light-emitting device to mitigate or obviate the aforementioned problems.

SUMMARY OF THE INVENTION

The main objective of the present invention is to provide a cooling fan with a light-emitting device. The light of the cooling fan can emit directly out of the case and can be arranged to any kind of pattern.

The cooling fan has a frame and at least one light-emitting diode (LED). The frame has a central block with a circuit and multiple ribs. The ribs are formed on the rear surface of the frame, extend to the center of the inner space and have at least one set hole. The at least one set hole is formed in the ribs. The at least one LED is mounted respectively in the at least one set hole to emit light and faces to the front surface of the frame.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
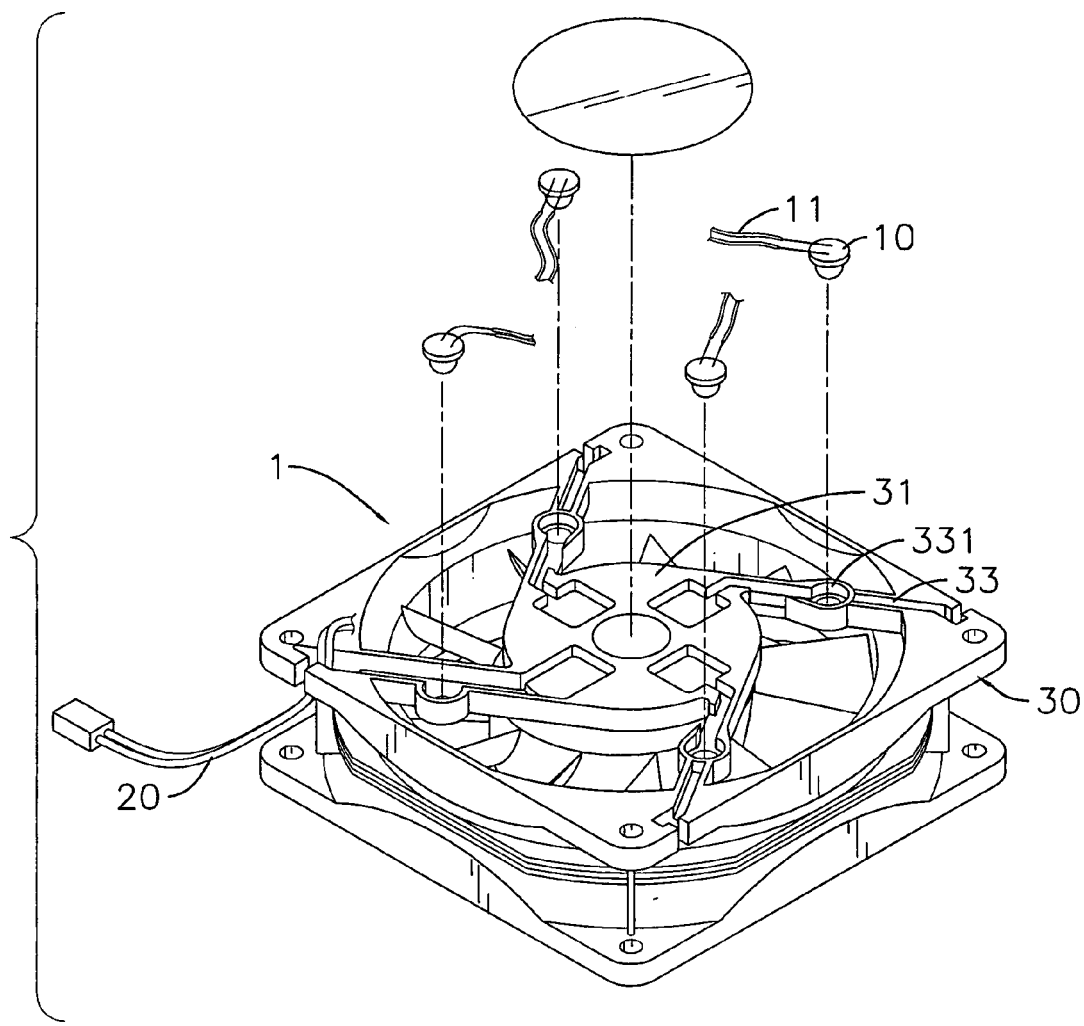
FIG. 1 is an exploded perspective view of a cooling fan with a light-emitting device in accordance with the present invention.

With reference to FIG. 1, a cooling fan (1) in accordance with the present invention has a frame (30), an electrical wire (20) and at least one light-emitting diode (LED) (10).

Figure 2:
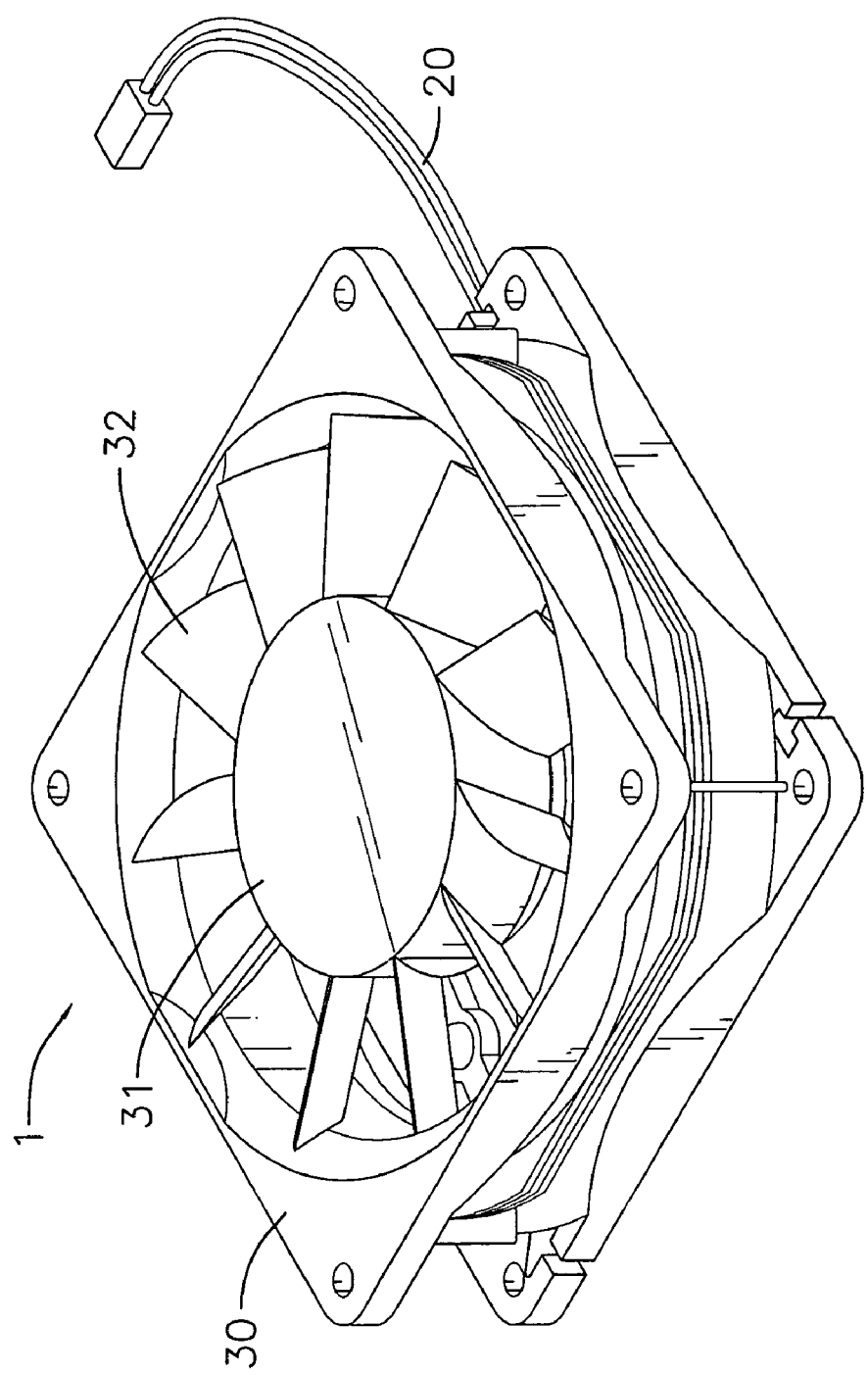
FIG. 2 is a perspective view of the cooling fan in FIG. 1.
Figure 3:
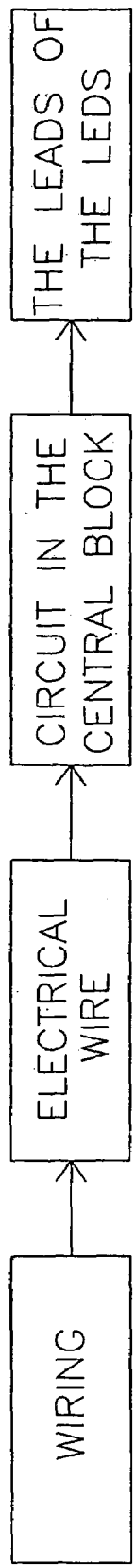
FIG. 3 is a flowchart of the electrical connection of the cooling fan in FIG. 1 with the computer.

With further reference to FIGS. 2 and 3, the frame (30) has an inner space, a rear surface, a front surface, multiple ribs (33), a central block (31), at least one set hole (331) and a rotor (32). The inner space has a center. The ribs (33) are formed on the rear surface of the frame (30) and extend to the center of the inner space. The at least one set hole (331) is formed in the ribs (33). The central block (31) is formed on the rear surface of the frame (30), is mounted between the ribs (33), is located at the center of the inner space and has a circuit. The rotor (32) is mounted on the central block (31) in the front surface of the frame (30).

The electrical wire (20) is mounted in the frame (30), connects with the circuit in the central block (31) and extends out of the frame (30). The at least one LED (10) is mounted respectively in the at least one set hole (331) to emit light, faces the front surface of the frame (30) and comprises two leads (11). The leads (11) connect with the circuit in the central block (31).

Figure 4:
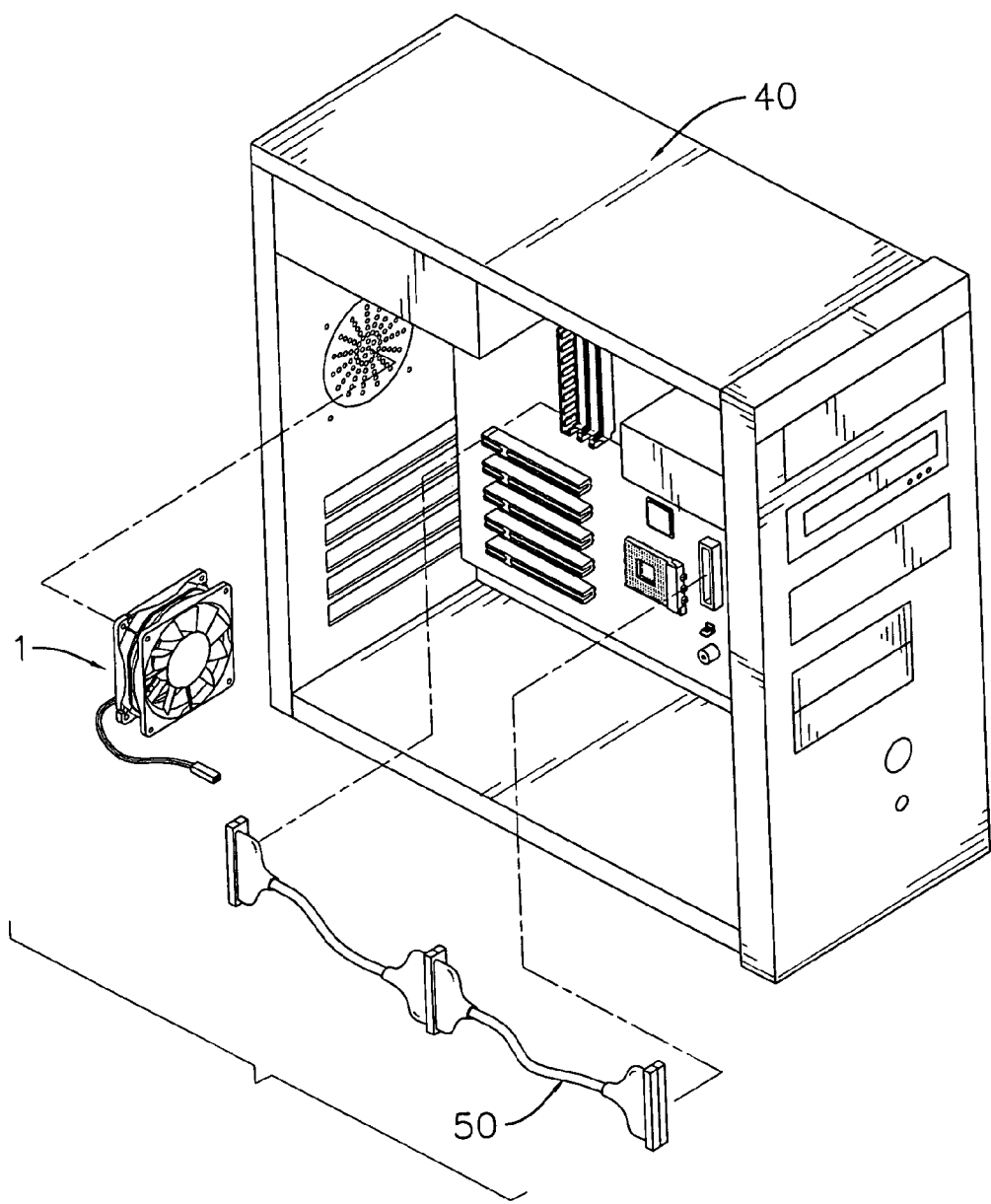
FIG. 4 is an exploded perspective view of a computer case with the cooling fan in FIG. 1.

With further reference to FIG. 4, a computer has a transparent case (40), multiple electrical elements and at least one electric cable (50). The cooling fan (1) can be attached to the case (40) or one of the electrical elements in the case (40) with the rear surface of the frame (30). The electrical wire (20) is electrically connected with the electric cable (50) to provide electrical power to the cooling fan (1) through the electric cable (50) and the electrical wire (20). In order to make the appearance of the computer more attractive, the at least one electric cable (50) can fluoresce.

The cooling fan (1) as described has numerous advantages. Because the at least one LED (10) faces to the front surface of the frame (30), the light emitted by the LED (10) goes out of the front surface of the frame (30) directly without any reflection. Therefore, brightness of the light emitted by the LED (10) will be enhanced and the light is clearly visible. If multiple LEDs (10) are used, the LEDs (10) can be arranged to any kind of pattern to show a logo for a company, a name or a design.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A cooling fan with a light-emitting device having
   a frame having
      an inner space having a center;
      a rear surface;
      a front surface;
      multiple ribs formed on the rear surface of the frame, extending to the center of the inner space;
      at least one set hole formed in the ribs;
      a central block mounted between the ribs from the rear surface to the front surface of the frame, located in the center of the inner space and having a circuit; and
      a rotor mounted on the central block in the front surface of the frame;

an electrical wire mounted in the frame, connecting with the circuit inside the central block and extending out of the frame; and at least one light-emitting diode (LED) mounted respectively in the at least one set hole to emit light and facing the front surface of the frame, and each one of the at least one light-emitting diode comprising two leads connecting with the circuit in the central block.

* * * * *